(12) United States Patent
Kawakubo

(10) Patent No.: US 9,401,284 B2
(45) Date of Patent: Jul. 26, 2016

(54) SEMICONDUCTOR DEVICE

(71) Applicant: SUMITOMO ELECTRIC DEVICE INNOVATIONS, INC., Yokohama-shi, Kanagawa (JP)

(72) Inventor: Hiroshi Kawakubo, Yokohama (JP)

(73) Assignee: SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 0 days.

(21) Appl. No.: 14/732,179

(22) Filed: Jun. 5, 2015

(65) Prior Publication Data

US 2015/0270137 A1 Sep. 24, 2015

Related U.S. Application Data

(62) Division of application No. 13/668,762, filed on Nov. 5, 2012, now Pat. No. 9,082,742.

(30) Foreign Application Priority Data

Nov. 4, 2011 (JP) ................................. 2011-242437

(51) Int. Cl.
*H01L 23/48* (2006.01)
*H01L 21/306* (2006.01)
(Continued)

(52) U.S. Cl.
CPC .......... *H01L 21/30612* (2013.01); *H01L 23/36* (2013.01); *H01L 24/03* (2013.01); *H01L 24/05* (2013.01); *H01L 24/27* (2013.01); *H01L 24/32* (2013.01); *H01L 24/83* (2013.01); *H01L 24/06* (2013.01); *H01L 24/29* (2013.01); *H01L 24/45* (2013.01); *H01L 24/48* (2013.01); *H01L 24/73* (2013.01); *H01L 2224/03002* (2013.01); *H01L 2224/0346* (2013.01); *H01L 2224/0347* (2013.01); *H01L 2224/04042* (2013.01); *H01L 2224/05005* (2013.01);
(Continued)

(58) Field of Classification Search
CPC ... H01L 21/30612; H01L 23/36; H01L 24/03; H01L 24/05; H01L 24/06; H01L 24/27; H01L 24/29; H01L 24/32; H01L 24/45; H01L 24/48; H01L 24/83
See application file for complete search history.

(56) References Cited

U.S. PATENT DOCUMENTS

| | | | |
|---|---|---|---|
| 6,335,265 B1 * | 1/2002 | Kosaki | H01L 21/6835 257/E21.174 |
| 2005/0127480 A1 * | 6/2005 | Elliott | H01L 23/4334 257/631 |

(Continued)

FOREIGN PATENT DOCUMENTS

JP 05-166849 A 7/1993

OTHER PUBLICATIONS

Office Action dated Nov. 18, 2014, issued in corresponding U.S. Appl. No. 13/668,762 (11 pages).

*Primary Examiner* — Whitney T Moore
*Assistant Examiner* — Joseph Galvin, III
(74) *Attorney, Agent, or Firm* — Westerman, Hattori, Daniels & Adrian, LLP

(57) ABSTRACT

A semiconductor device includes: a substrate comprised by gallium arsenide; an active layer provided on the substrate; a first nickel-plated layer provided on a lower face of the substrate facing the active layer; a copper-plated layer provided on a lower face of the first nickel-plated layer; and a second nickel-plated layer provided on a lower face of the copper-plated layer.

9 Claims, 10 Drawing Sheets

(51) Int. Cl.
*H01L 23/00* (2006.01)
*H01L 23/36* (2006.01)

(52) U.S. Cl.
CPC ......... *H01L 2224/05083* (2013.01); *H01L 2224/05147* (2013.01); *H01L 2224/05155* (2013.01); *H01L 2224/05644* (2013.01); *H01L 2224/06181* (2013.01); *H01L 2224/06519* (2013.01); *H01L 2224/27462* (2013.01); *H01L 2224/29144* (2013.01); *H01L 2224/32225* (2013.01); *H01L 2224/32245* (2013.01); *H01L 2224/45124* (2013.01); *H01L 2224/45144* (2013.01); *H01L 2224/48091* (2013.01); *H01L 2224/48247* (2013.01); *H01L 2224/48599* (2013.01); *H01L 2224/48644* (2013.01); *H01L 2224/48699* (2013.01); *H01L 2224/48744* (2013.01); *H01L 2224/73265* (2013.01); *H01L 2924/014* (2013.01); *H01L 2924/0105* (2013.01); *H01L 2924/01028* (2013.01); *H01L 2924/01029* (2013.01); *H01L 2924/01079* (2013.01); *H01L 2924/10329* (2013.01); *H01L 2924/1301* (2013.01); *H01L 2924/1305* (2013.01); *H01L 2924/1306* (2013.01); *H01L 2924/13055* (2013.01); *H01L 2924/16195* (2013.01); *H01L 2924/2064* (2013.01); *H01L 2924/3511* (2013.01)

(56) References Cited

U.S. PATENT DOCUMENTS

| | | | |
|---|---|---|---|
| 2011/0025193 A1* | 2/2011 | Daicho | C09K 11/7734 313/503 |
| 2012/0175755 A1* | 7/2012 | Bayerer | H01L 24/05 257/675 |
| 2012/0199873 A1 | 8/2012 | Matsumura et al. | |
| 2012/0315502 A1 | 12/2012 | Nitta et al. | |

* cited by examiner

SEMICONDUCTOR DEVICE

CROSS-REFERENCE TO RELATED APPLICATION

This application is a divisional of application Ser. No. 13/668,762, filed on Nov. 5, 2012, which is based upon and claims the benefit of priority of the prior Japanese Patent Application No. 2011-242437, filed on Nov. 4, 2011, the entire contents of which are incorporated herein by reference.

BACKGROUND (i) Technical Field

The present invention relates to a semiconductor device.

(ii) Related Art

A semiconductor device including gallium arsenide (GaAs) is used as a power device for high frequency amplification. An active element such as an FET (Field Effect Transistor) and a passive element are provided on a substrate made of GaAs. The active element generates heat because of operation thereof. It is therefore necessary to release the heat. There is a case where a thickness of a substrate made of GaAs is reduced in order to improve radiation performance of a semiconductor chip. However, the GaAs substrate may be damaged during a handling in a manufacturing process thereof, because the GaAs substrate is fragile. And so, the substrate may be reinforced by a PHS (Plated Heat Sink) and the radiation performance may be enhanced. Gold may be used for the PHS. Japanese Patent Application Publication No. 5-166849 discloses that a PHS made of gold is provided on a lower face of a semiconductor substrate.

SUMMARY

It is an object to provide a semiconductor device that achieves preferable radiation performance and suppresses warp thereof.

According to an aspect of the present invention, there is provided a semiconductor device including: a substrate comprised by gallium arsenide; an active layer provided on an upper face of the substrate; a first nickel-plated layer provided on a lower face of the substrate; a copper-plated layer provided on the first nickel-plated layer; and a second nickel-plated layer provided on the copper-plated layer.

According to another aspect of the present invention, there is provided a semiconductor device including: a substrate; an active layer provided on an upper face of the substrate; a first nickel-plated layer provided on a lower face of the substrate; a copper-plated layer provided on the first nickel-plated layer; and a second nickel-plated layer provided on a lower face and side face of the copper-plated layer and a side face of the substrate.

DETAILED DESCRIPTION

It is preferable that a thickness of a GaAs substrate is reduced in order to achieve preferable radiation performance, and it is preferable that a thickness of a PHS is enlarged in order to reinforce the GaAs substrate. However, when the PHS is thick, a mounting of a semiconductor chip causes a large warp. In particular, the warp is enlarged because a thermal expansion coefficient of Au or the like used for the PHS is large.

Figure 1A:
FIG. 1A through FIG. 1C illustrate a schematic view of a warp of a semiconductor chip.
Figure 1B:
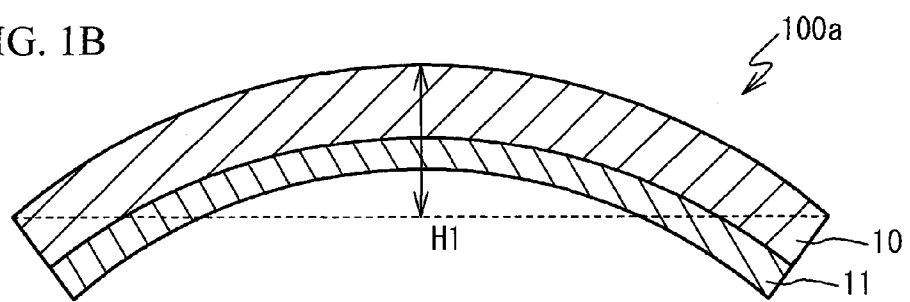
Figure 1C:
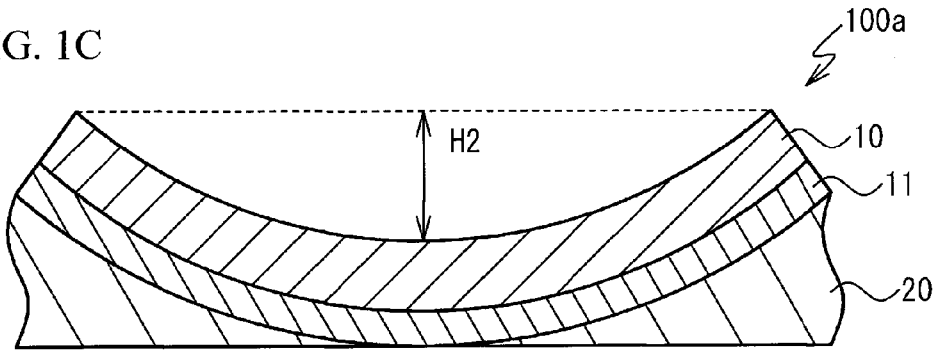

First, a description will be given of a warp of a semiconductor chip. FIG. 1A through FIG. 1C illustrate a schematic view of the warp of a semiconductor chip 100a. The semiconductor chip 100a is simplified in FIG. 1A through FIG. 1C.

In FIG. 1A, a semiconductor substrate 10 is not warped. As illustrated in FIG. 1B, a PHS 11 made of Au, Cu or the like is provided on a lower face of the semiconductor substrate 10, and thereby the semiconductor chip 100a is formed. Because of internal stress of the PHS 11, a warp in a convex direction occurs so that a center portion of the semiconductor chip 100a rises. As illustrated in FIG. 1C, the semiconductor chip 100a is mounted on a mount substrate made of Cu or the like by a solder 20 made of gold-tin (AuSn) or the like. In this case, the semiconductor chip 100a is heated to 280 degrees C. or more where the solder 20 is softened. A warp in concave direction occurs so that an end portion of the semiconductor chip 100a rises, because a difference of thermal expansion coefficient between the GaAs and the PHS 11 is large. When a warp amount is large, the solder 20 is hardened and the semiconductor chip 100a is fixed, with the semiconductor chip 100a being peeled from the mount substrate. Thus, cracking may occur in the semiconductor chip 100a. Next, a description will be given of a first embodiment.

[First Embodiment]

Figure 2A:
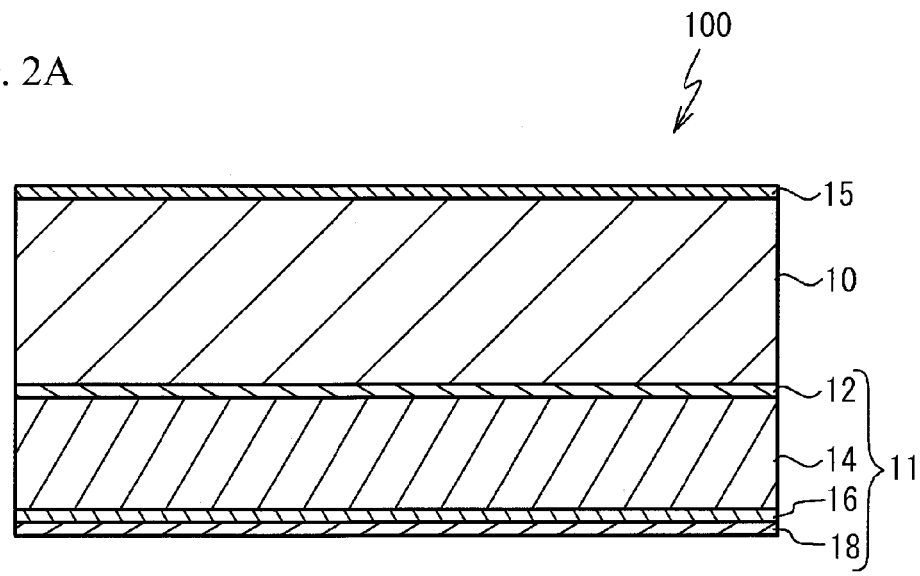
FIG. 2A illustrates a cross sectional view of a semiconductor chip in accordance with a first embodiment.
Figure 2B:
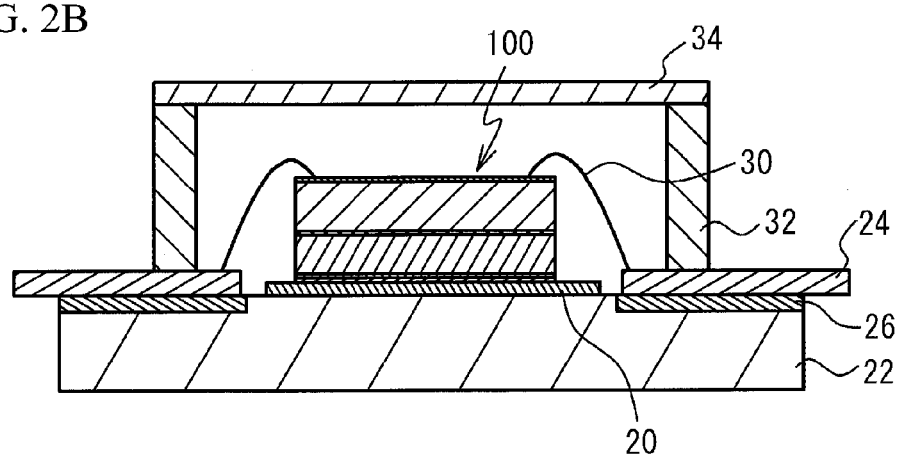
FIG. 2B illustrates a cross sectional view of an example of mounting of the semiconductor chip.

A first embodiment is an example where a warp amount in the concave direction after mounting is reduced, by using a PHS made of nickel (Ni)/Cu/Ni and enlarging the warp in the convex direction before the mounting. FIG. 2A illustrates a cross sectional view of a semiconductor chip 100 in accordance with the first embodiment. In FIG. 2A and FIG. 2B, the PHS 11 is simplified, and a seed metal is not illustrated.

As illustrated in FIG. 2A, an active layer 15 that is made of GaAs and acts as an element such as an FET is provided on an upper face of the semiconductor substrate 10 made of GaAs. A first Ni layer 12 (first nickel-plated layer) is provided on a lower face of the semiconductor substrate 10 facing the active layer 15. A Cu layer 14 (Cu-plated layer) is provided on a lower face of the first Ni layer 12. A second Ni layer 16 (second nickel-plated layer) is provided on a lower face of the Cu layer 14. An Au layer 18 is provided on a lower face of the second Ni layer 16. The first Ni layer 12, the Cu layer 14, the second Ni layer 16 and the Au layer 18 act as the PHS 11 releasing heat generated in an element provided on the semiconductor substrate 10. The first Ni layer 12 contacts with a seed metal made of Au on the lower face of the semiconductor substrate 10. The Cu layer 14 contacts with the lower face of the first Ni layer 12. The second Ni layer 16 contacts with the lower face of the Cu layer 14. The Au layer 18 contacts with the lower face of the second Ni layer 16.

A thickness of the semiconductor substrate 10 is, for example, 20 μm to 30 μm. A thickness of the Cu layer 14 is, for example, 5 μm to 30 μm. A Thickness of the first Ni layer 12 and the second Ni layer 16 is, for example, 0.5 μm to 3 μm. A thickness of the Au layer 18 is, for example, 0.8 μm to 3 μm.

FIG. 2B illustrates a cross sectional view of an example of mounting of the semiconductor chip 100. As illustrated in FIG. 2B, the semiconductor chip 100 is mounted on an upper face of a mount substrate 22 by the solder 20 (adhesive agent) provided on the lower face of the PHS 11. A lead frame 24 is provided on an insulating region 26 of the mount substrate 22. The semiconductor chip 100 is electrically coupled to the lead frame 24 via a bonding wire 30. The semiconductor chip 100 is sealed by a sidewall 32 and a cap 34 that are made of an insulating material such as ceramics. The solder 20 includes AuSn or the like. The mount substrate 22 and the lead frame 24 include a metal such as Cu. The bonding wire 30 is, for example, made of a metal such as aluminum (Al) or Au. Heat generated in the semiconductor chip 100 is released via the PHS 11 and the mount substrate 22.

Next, a description will be given of a method for manufacturing the semiconductor chip 100. FIG. 3A through FIG. 4C illustrate a cross sectional view of the method for manufacturing the semiconductor chip 100 in accordance with the first embodiment. In FIG. 3A through FIG. 4C, the active layer 15 is not illustrated.

Figure 3A:
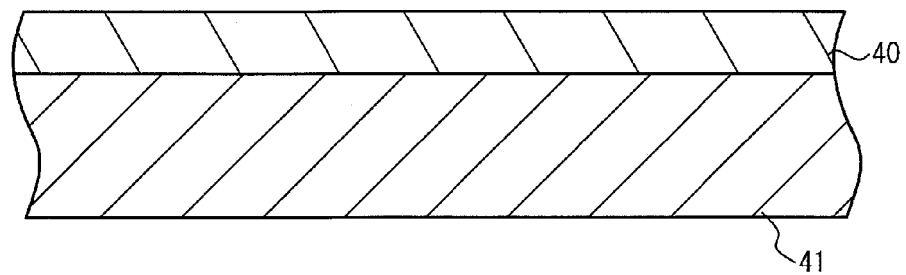
FIG. 3A through FIG. 3C illustrate a cross sectional view of a method for manufacturing the semiconductor chip in accordance with the first embodiment.
Figure 3B:
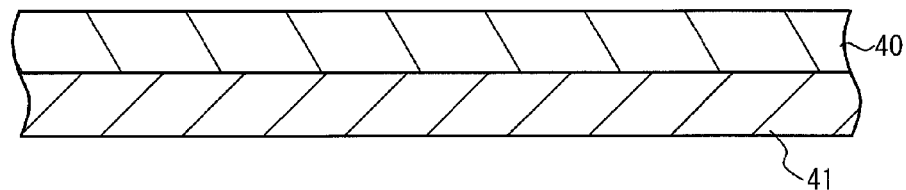
Figure 3C:
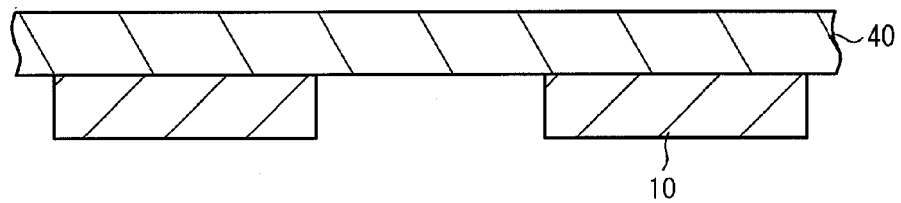

As illustrated in FIG. 3A, a wafer 41 including GaAs is attached to a lower face of a support member 40 made of glass or the like by a wax or the like. An upper face of the wafer 41 on which an element is provided is bonded to the lower face of the support member 40. As illustrated in FIG. 3B, the wafer 41 is grinded, and the thickness of the wafer 41 is reduced. As illustrated in FIG. 3C, a part of the wafer 41 is removed along a scribe line by an etching method or the like. Thereby, the semiconductor substrate 10 divided into a chip is formed.

Figure 4A:
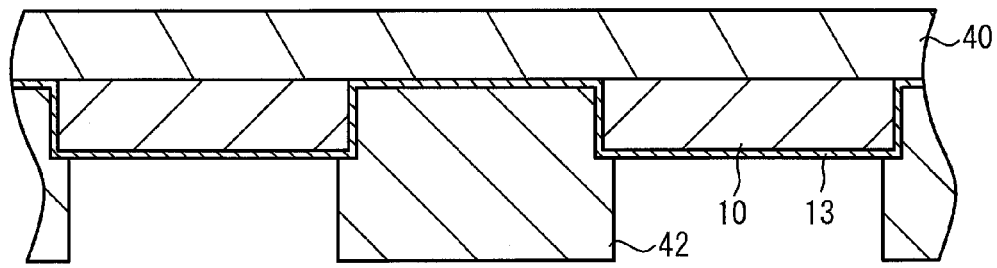
FIG. 4A through FIG. 4C illustrate the cross sectional view of the method for manufacturing the semiconductor chip in accordance with the first embodiment.
Figure 4B:
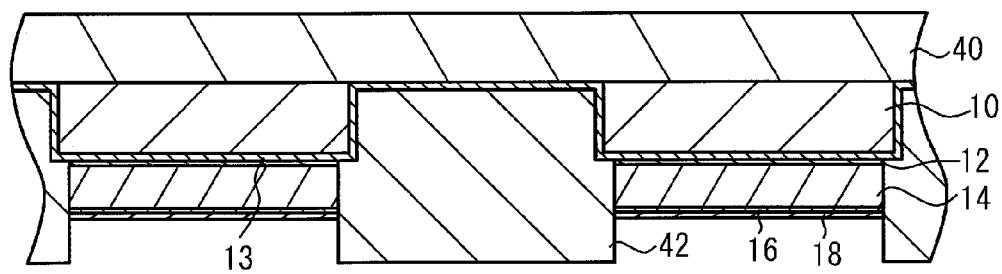
Figure 4C:
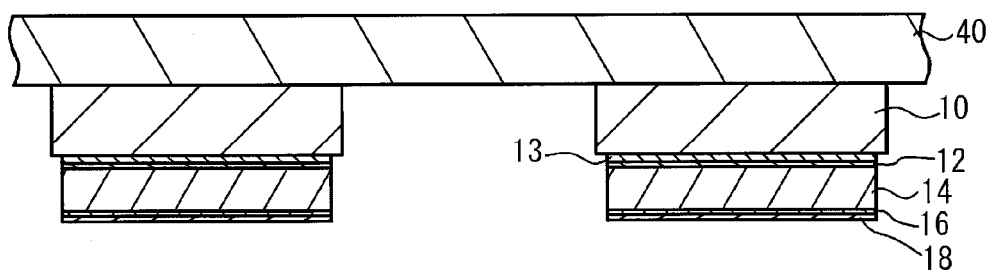

As illustrated in FIG. 4A, a seed metal 13 made of Au or the like is provided on the lower face of the support member 40 and the lower face and the side face of the semiconductor substrate 10. Further, a resist 42 is provided between a plurality of the semiconductor substrates 10. As illustrated in FIG. 4B, the first Ni layer 12, the Cu layer 14, the second Ni layer 16 and the Au layer 18 are formed by an electrolytic plating method. The seed metal 13 acts as a power feeder line. In the forming process of the first Ni layer 12 and the second Ni layer 16, a nickel sulfamate plating bath is used at 55 degrees C. or the like. In the forming process of the Cu layer 14, copper sulfate plating bath is used at 25 degrees C. or the like at a current density of 2 A/dm$^2$. The Au layer 18 is formed by forming a thin Au layer (flash-plated layer) and forming a thick Au layer after forming the thin Au layer. In the forming process of the Au layer 18, an Au sulfite plating bath is used at 55 degrees C. at a current density of 0.1 to 0.5 A/dm$^2$. As illustrated in FIG. 4C, the resist 42 and the seed metal 13 are removed. Thus, the semiconductor chip 100 is manufactured.

The Ni formed by the electro plating has compression stress. In the PHS 11, the Cu layer 14 is sandwiched by the Ni layers. Therefore, the semiconductor chip 100 is greatly warped in the convex portion illustrated in FIG. 1B. A warp amount H1 is 20 μm to 25 μm or the like. The semiconductor chip 100 is mounted on the mount substrate 22 by the solder 20. Because of the difference of the thermal expansion coefficient, the semiconductor chip 100 is warped in the concave direction illustrated in FIG. 1C. The warp amount in the convex portion is large. Therefore, the warp in the concave direction is canceled. A warp amount H2 in the concave direction is 30 μm to 50 μm or the like.

A description will be given of an experiment demonstrating the warp amount. In the experiment, the thickness of the PHS was changed in the first embodiment and a comparative example, and the warp amount was measured before and after the experiment. A description will be given of the comparative example.

Figure 5:
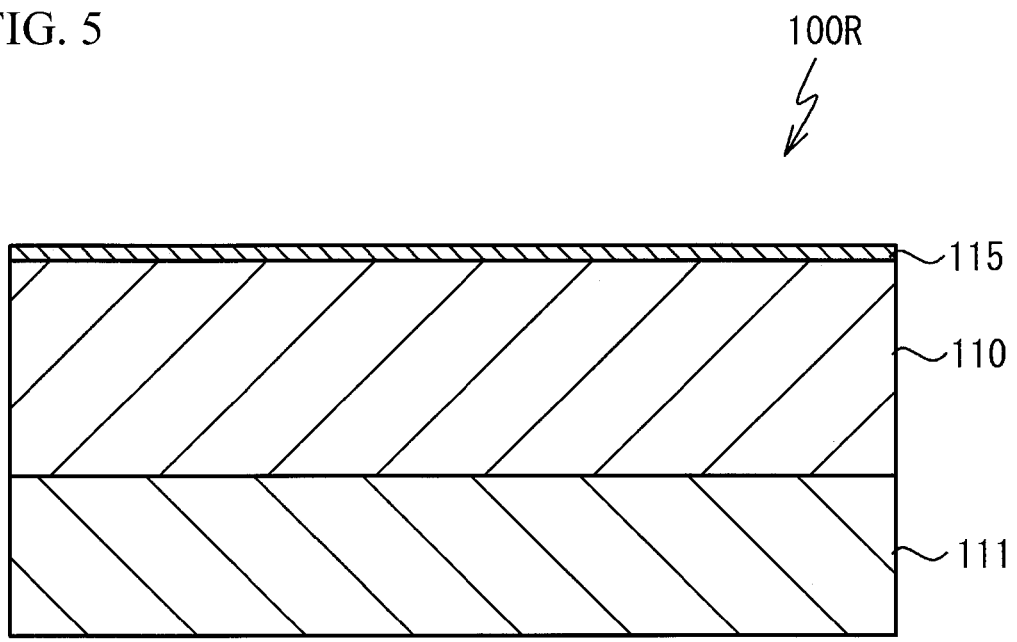
FIG. 5 illustrates a cross sectional view of a semiconductor chip in accordance with a comparative example.

FIG. 5 illustrates a cross sectional view of a semiconductor chip 100R in accordance with the comparative example. As illustrated in FIG. 5, the semiconductor chip 100R has a semiconductor substrate 110, an active layer 115 and a PHS 111. The semiconductor substrate 110 is made of GaAs. The PHS 111 is made of Au.

In both the first embodiment and the comparative example, a chip size of the semiconductor chip is 9.3 mm$^2$. A thickness of the semiconductor substrate is 28 μm. The chip size is an area (surface area) of the upper face of the semiconductor substrate. The thickness of the first Ni layer 12 and the second Ni layer 16 in the PHS 11 is 1 μm. The thickness of the Cu layer 14 was changed to 5 μm, 10 μm and 20 μm. Next, a description will be given of the experiment result.

Figure 6:
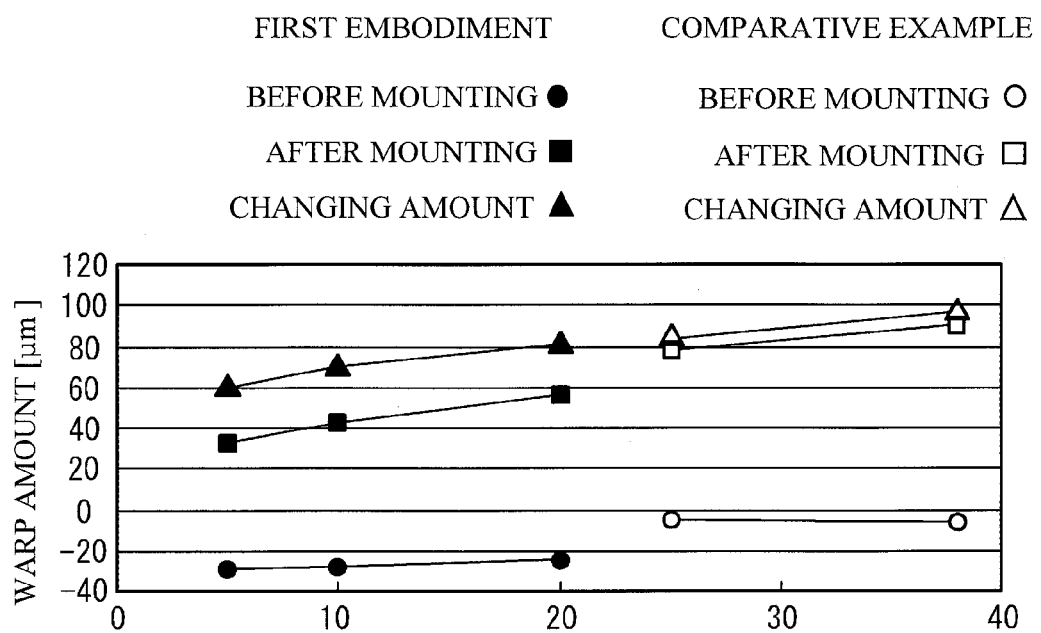
FIG. 6 illustrates a graph of an experiment result.

FIG. 6 illustrates a graph of the experiment result. A horizontal axis indicates the thickness of the Cu layer 14 structuring the PHS 11 or the thickness of the PHS 111. A vertical axis indicates the warp amount. The warp amount H1 in the direction of FIG. 1B has a negative value. The warp amount H2 in the direction of FIG. 1C has a positive value. Black marks indicate the warp amount of the first embodiment. White marks indicate the warp amount of the comparative example. Circles indicate the warp amount before mounting. Squares indicate the warp amount after the mounting. Triangles indicate the changing amount of the warp amount between before the mounting and after the mounting.

As illustrated in FIG. 6, in the comparative example, the warp amount before the mounting is approximately −10 μm to −5 μm. The warp amount after the mounting is approximately 80 μm to 90 μm. The changing amount of the warp is 85 μm to 100 μm. As described with reference to FIG. 1A through FIG. 1C, the warp amount after the mounting is large. Therefore, the semiconductor chip may be damaged, or a defect of mounting may occur. In particular, the strength of Au is low. Therefore, enlarging the thickness of the PHS 11 is required. The thicker the PHS 111 is, the larger the warp amount is.

In contrast, in the first embodiment, the warp amount before the mounting is approximately −30 μm to −20 μm. The warp amount after the mounting is 30 μm to 60 μm. The changing amount is 60 μm to 80 μm. In accordance with the first embodiment, the warp amount before the mounting is enlarged because of Ni. Therefore, the warp in the concave direction during the mounting is reduced. And, it is possible to reduce the thickness of the PHS 11 of the first embodiment more than the thickness of the PHS 111 of the comparative example, because strength of Cu and Ni is higher than that of Au. Therefore, the warp amount gets smaller. And, the damage of the semiconductor chip is suppressed, and the mounting of the semiconductor chip is successfully performed.

The Cu layer 14 has preferable thermal conductivity. Therefore, the heat radiation from the semiconductor substrate 10 is effectively performed. When the thickness of the Cu layer 14 is 5 μm to 20 μm and the thickness of the first Ni layer 12 and the second Ni layer 16 is 1 μm to 3 μm, the thermal resistance of the PHS 11 is 4.04° C./W to 4.51° C./W. When the thickness of the PHS 111 of the comparative example is 28 μm to 40 μm, the thermal resistance is 4.42° C./W to 4.61° C./W. The first embodiment achieves approximately the same radiation performance as the comparative example.

As described above, the strength of Cu and Ni is higher than that of Au, it is possible to reduce the thickness of the PHS 11. Therefore, the warp amount can be reduced, and the cost can be reduced. In order to reduce the warp amount, it is preferable that the Cu layer 14 is thin. However, when the Cu layer 14 is thin, the strength of the Cu layer 14 is reduced, and the Cu layer 14 may be damaged because of the handling. When the chip size is large, the cracking tends to occur. And, peeling of the semiconductor chip illustrated in FIG. 1C tends to occur. Therefore, when the chip size is large, it is preferable that the Cu layer 14 is thick.

An experiment for reviewing the thickness of the Cu layer 14 achieving sufficient strength was performed. The semiconductor chip 100 of FIG. 2A was used as a sample.

The chip size S and the thickness T of the Cu layer 14 were changed. The warp amount and the strength were measured. And, an appropriate thickness was reviewed. The results are shown in Table 1.

TABLE 1

| CHIP SIZE S [mm$^2$] | THICKNESS T [μm] |
|---|---|
| S < 1 | 5 ≤ T < 8 |
| 1 ≤ S < 9 | 8 ≤ T ≤ 10 |
| 9 ≤ S | 16 ≤ T ≤ 25 |

As shown in Table 1, when the chip size S is less than 1 mm$^2$, it is preferable that the thickness T of the Cu layer 14 is 5 μm or more to less than 8 μm. When the chip size S is 1 mm$^2$ or more to less than 9 mm$^2$, it is preferable that the thickness T is 8 μm or more to 10 μm or less. When the chip size S is 9 mm$^2$ or more, it is preferable that the thickness T is 16 μm or more to 25 μm or less. Even if the chip size S is 1 mm$^2$ or more to less than 9 mm$^2$, the thickness T can be 16 μm or more to 25 μm or less.

The first Ni layer 12 also acts as a diffusion-preventing layer for suppressing the diffusion of Cu into the semiconductor substrate 10. The second Ni layer 16 also acts as a diffusion-preventing layer for suppressing the diffusion of Cu into the Au layer 18. When the first Ni layer 12 and the second Ni layer 16 are excessively thin, it is difficult to suppress the diffusion of Cu and reduce the warp amount. And the strength of the semiconductor chip 100 is reduced. When the first Ni layer 12 and the second Ni layer 16 are excessively thick, the thermal resistance gets larger. It is therefore preferable that the thickness of the first Ni layer 12 is 0.5 μm to 3 μm, 0.6 μm to 2.9 μm, or 0.7 μm to 2.8 μm. In order to reduce the warp amount and strengthen the Ni layers, it is preferable that the thickness is 0.5 μm or more. When the thickness is 1 μm or more, the warp amount hardly fluctuates. On the other hand, when the thickness is 3 μm or more, the thermal resistance gets higher. Therefore, it is preferable that the first Ni layer 12 is 0.5 μm to 3 μm, and more preferably, 1 μm to 3 μm. It is preferable that the second Ni layer 16 is within the same range as the first Ni layer 12. The thickness of the first Ni layer 12 may be different from that of the second Ni layer 16.

The Au layer 18 acts as an oxidation-preventing layer for suppressing the oxidation of Ni and a diffusion-preventing layer for suppressing the diffusion of Cu into the solder 20. Wettability between the Au and the AuSn of the solder 20 is high. Therefore, reliability of mounting is improved. In order to suppress the diffusion of Cu and achieve high wettability, it is preferable that the Au layer 18 is thick. However, when the Au layer 18 is excessively thick, the warp amount gets larger. It is therefore preferable that the thickness of the Au layer 18 is 0.8 μm to 3 μm, 0.9 μm to 2.9 μm, or 1.0 μm to 2.8 μm.

[Second Embodiment]

Figure 7:
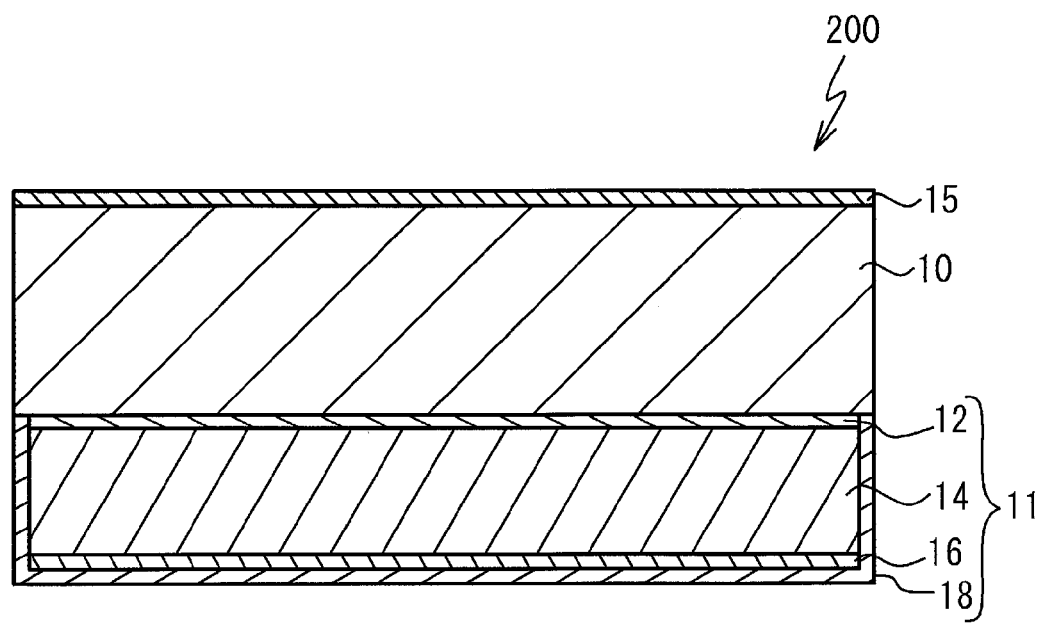
FIG. 7 illustrates a cross sectional view of a semiconductor chip in accordance with a second embodiment.

A second embodiment is an example in which the structure of the Au layer 18 is changed. FIG. 7 illustrates a cross sectional view of a semiconductor chip 200 in accordance with the second embodiment. As illustrated in FIG. 7, the Au layer 18 in the semiconductor chip 200 covers the side face of the first Ni layer 12, the side face of the Cu layer 14 and the side face of the second Ni layer 16. The side faces of the first Ni layer 12, the Cu layer 14 and the second Ni layer 16 are protected by the Au layer 18. Therefore, the oxidation of the first Ni layer 12, the Cu layer 14 and the second Ni layer 16 is suppressed.

A description will be given of a method for manufacturing the semiconductor chip 200. FIG. 8A through FIG. 8D illustrate a cross sectional view illustrating the method for manufacturing the semiconductor chip 200. The processes of FIG. 3A through FIG. 4A are common in both the first embodiment and the second embodiment.

Figure 8A:
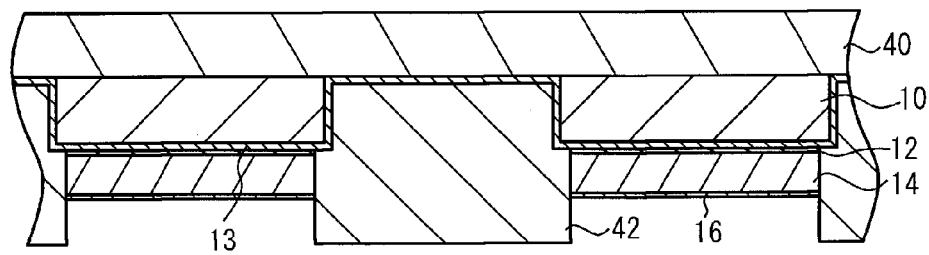
FIG. 8A through FIG. 8D illustrate a cross sectional view illustrating a method for manufacturing the semiconductor chip in accordance with the second embodiment.
Figure 8B:
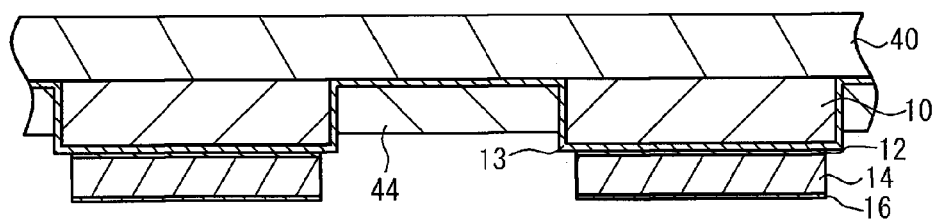
Figure 8C:
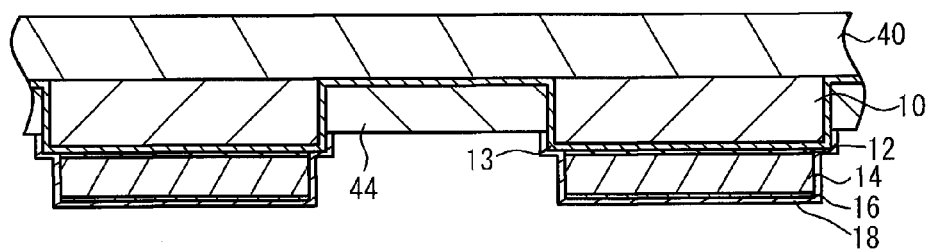
Figure 8D:
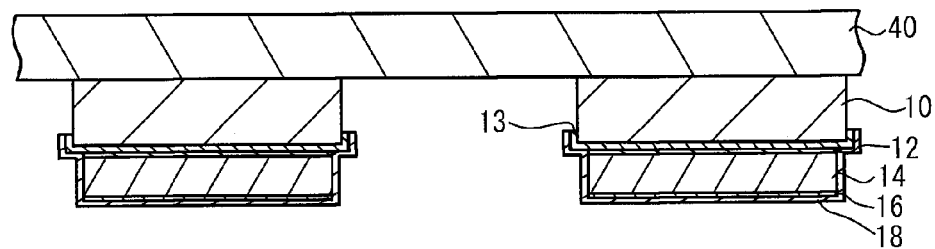

As illustrated in FIG. 8A, the first Ni layer 12, the Cu layer 14 and the second Ni layer 16 are formed by an electro plating method. As illustrated in FIG. 8B, after removing the resist 42, a resist 44 is provided between the semiconductor substrates 10. As illustrated in FIG. 8C, the Au layer 18 is formed by the electro plating method. As illustrated in FIG. 8D, the resist 44 and the seed metal 13 are removed. Thus, the semiconductor chip 200 is manufactured.

[Third Embodiment]

Figure 9A:
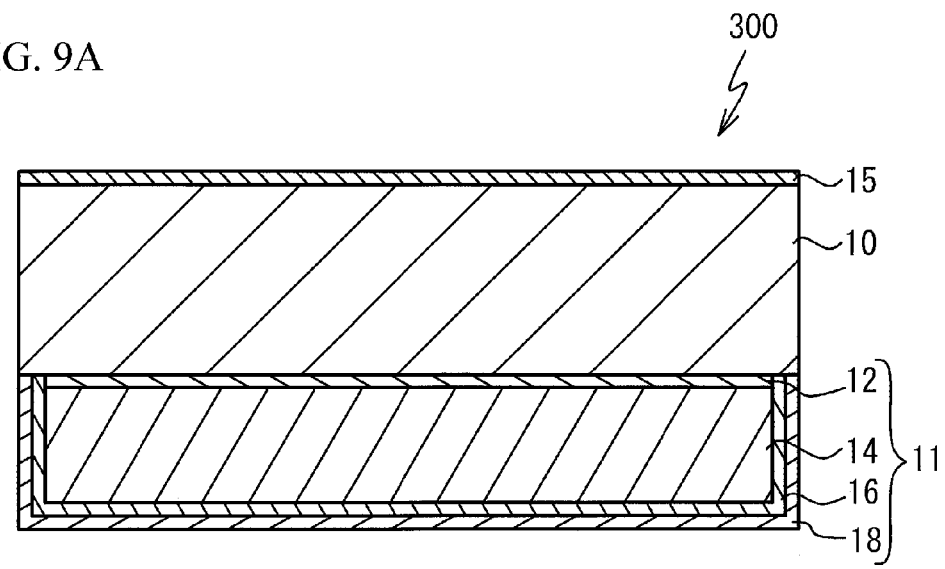
FIG. 9A illustrates a cross sectional view of a semiconductor chip in accordance with a third embodiment.
Figure 9B:
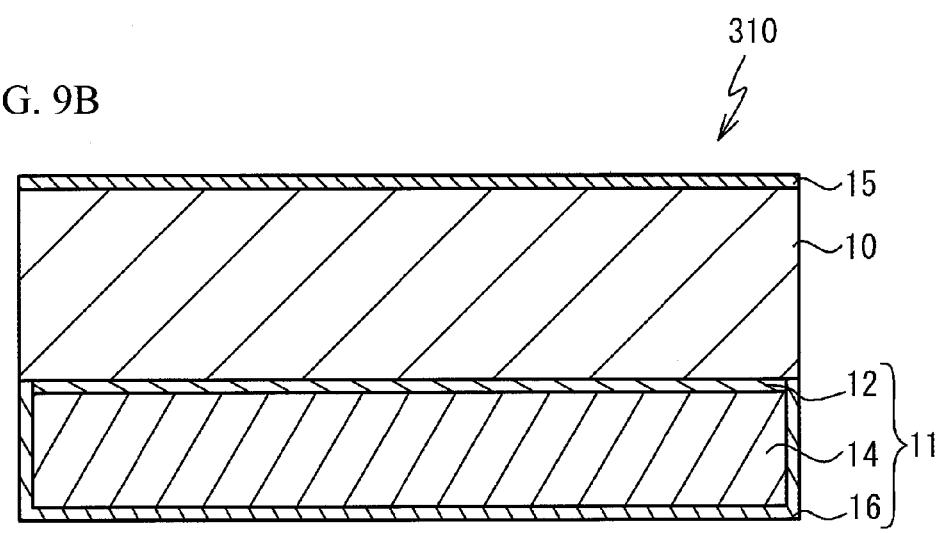
FIG. 9B illustrates a cross sectional view of a semiconductor chip in accordance with a modified embodiment of the third embodiment.

A third embodiment is an example in which the structure of the second Ni layer 16 and the Au layer 18 is changed. FIG. 9A illustrates a cross sectional view of a semiconductor chip 300 in accordance with the third embodiment. As illustrated in FIG. 9A, the second Ni layer 16 of the semiconductor chip 300 covers the side face of the first Ni layer 12 and the side face of the Cu layer 14. The Au layer 18 covers the side face of the second Ni layer 16. The first Ni layer 12 and the Cu layer 14 are protected by the second Ni layer 16 and the Au layer 18. Therefore the oxidation of the first Ni layer 12 and the Cu layer 14 is suppressed. The second Ni layer 16 is protected by the Au layer 18. Therefore, the oxidation of the second Ni layer 16 is suppressed. FIG. 9B illustrates a cross sectional view of a semiconductor chip 310 in accordance with a modified embodiment of the third embodiment. Even if the Au layer 18 is not provided as illustrated in FIG. 9B, the second Ni layer 16 may cover the side face and the lower face of the Cu layer 14.

FIG. 10A through FIG. 10D illustrate a cross sectional view illustrating a method for manufacturing the semiconductor chip 300 in accordance with the third embodiment. The processes of FIG. 3A through FIG. 4A are common in both the first embodiment and the third embodiment.

Figure 10A:
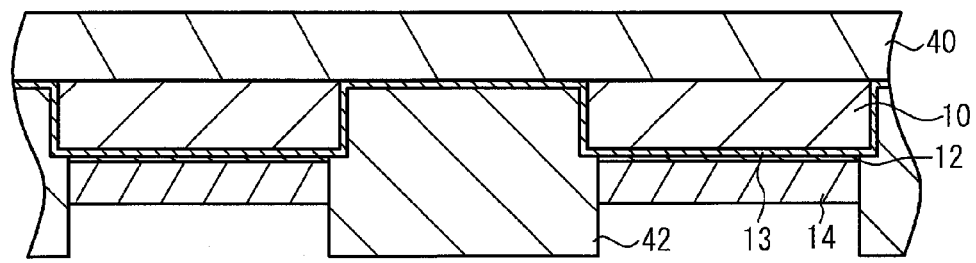
FIG. 10A through FIG. 10D illustrate a cross sectional view illustrating a method for manufacturing the semiconductor chip in accordance with the third embodiment.
Figure 10B:
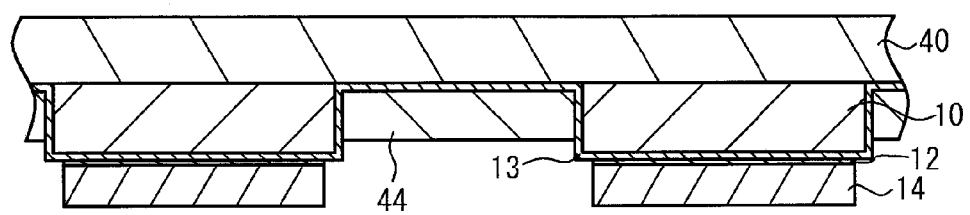
Figure 10C:
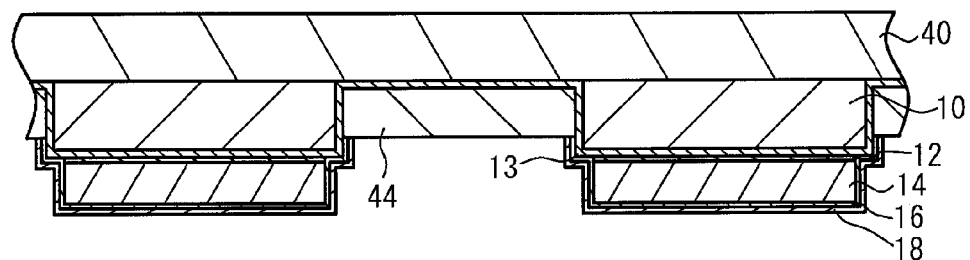
Figure 10D:
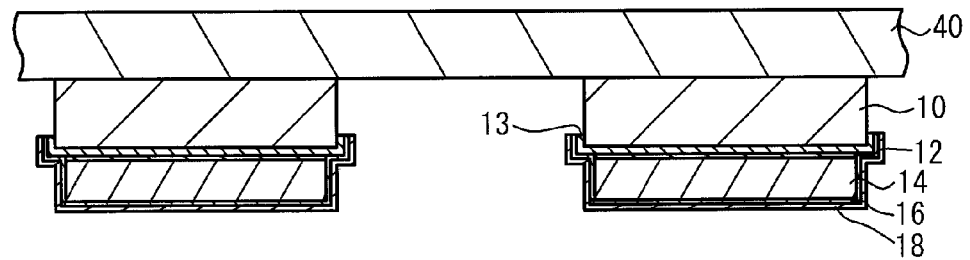

As illustrated in FIG. 10A, the first Ni layer 12 and the Cu layer 14 are formed by the electro plating method. As illustrated in FIG. 10B, after removing the resist 42, the resist 44 is provided. As illustrated in FIG. 10C, the second Ni layer 16 and the Au layer 18 are formed by the electrolytic plating method. As illustrated in FIG. 10D, the resist 44 and the seed metal 13 are removed. Thus, the semiconductor chip 300 is manufactured. The explanation of the method for manufacturing the semiconductor chip 310 is omitted.

The first embodiment through the third embodiment can be applied to a semiconductor device including a power device such a IGBT (Insulated Gate Bipolar Transistor) or a thyristor.

The present invention is not limited to the specifically disclosed embodiments and variations but may include other embodiments and variations without departing from the scope of the present invention.

What is claimed is:

1. A method for manufacturing a semiconductor device comprising:
    providing an active layer on an upper face of a substrate;
    etching selectively the substrate from a lower face of the substrate so as to expose a side face of the substrate;
    providing a first nickel-plated layer on the lower face of the substrate;
    providing a copper-plated layer on a lower face of the first nickel-plated layer after providing the first nickel-plated layer; and
    providing a second nickel-plated layer on a lower face and a side face of the copper-plated layer, a side face of the first nickel-plated layer and the side face of the substrate after providing the copper-plated layer wherein;
    when a surface area of the substrate is less than 1 mm$^2$, a thickness of the copper-plated layer is 5 µm or more to less than 8 µm;
    when the surface area of the substrate is 1 mm$^2$ or more to less than 9 mm$^2$, the thickness of the copper-plated layer is 8 µm or more to 10 µm or less;
    when the surface area of the substrate is 9 mm$^2$ or more, the thickness of the copper-plated layer is 16 µm or more to 25 µm or less.

2. The method as claimed in claim 1, wherein the substrate is penetrated by the etching.

3. The method as claimed in claim 1 further comprising: providing a gold layer on the second nickel-plated layer.

4. The method as claimed in claim 3, wherein the gold layer is fixed to a mounting substrate by an adhesive agent including gold-tin.

5. The method as claimed in claim 1, wherein a thickness of the substrate is 20 µm or more to 40 µm or less.

6. The method as claimed in claim 1, wherein a thickness of the first nickel-plated layer and a thickness of the second nickel-plated layer are 0.5 µm or more to 3 µm or less.

7. The method as claimed in claim 1, wherein the first nickel-plated layer, the copper-plated layer and the second nickel-plated layer are formed by electro plating.

8. The method as claimed in claim 1, wherein the etching is carried out when the upper face of the substrate is bonded to a lower face of a support member.

9. The method as claimed in claim 4, wherein a warp amount of the substrate is 30 µm to 60 µm after fixing to the mounting substrate.

* * * * *